(12) United States Patent
Dwilinski et al.

(10) Patent No.: US 7,374,615 B2
(45) Date of Patent: May 20, 2008

(54) METHOD AND EQUIPMENT FOR MANUFACTURING ALUMINUM NITRIDE BULK SINGLE CRYSTAL

(75) Inventors: Robert Dwilinski, Warsaw (PL); Roman Doradzinski, Warsaw (PL); Jerzy Garczynski, Lomianki (PL); Leszek Sierzputowski, Union, NJ (US); Yasuo Kanbara, Anan (JP)

(73) Assignees: Ammono.SP.ZO.O, Warsaw (PL); Nichia Corporation, Anan-shi, Tokushima (JP)

( * ) Notice: Subject to any disclaimer, the term of this patent is extended or adjusted under 35 U.S.C. 154(b) by 0 days.

(21) Appl. No.: 10/479,858

(22) PCT Filed: Jun. 6, 2002

(86) PCT No.: PCT/JP02/05624

§ 371 (c)(1),
(2), (4) Date: Aug. 31, 2004

(87) PCT Pub. No.: WO02/101124

PCT Pub. Date: Dec. 19, 2002

(65) Prior Publication Data

US 2005/0087124 A1 Apr. 28, 2005

(30) Foreign Application Priority Data

Jun. 6, 2001 (PL) ..................... 347918

(51) Int. Cl.
*C30B 7/10* (2006.01)
(52) U.S. Cl. .............. 117/68; 117/69; 117/70; 117/73
(58) Field of Classification Search .......... 117/68, 117/69, 70, 73
See application file for complete search history.

(56) References Cited

U.S. PATENT DOCUMENTS

| 5,096,860 | A | * | 3/1992 | Nadkarni ............. 501/98.4 |
| 5,456,204 | A | | 10/1995 | Dimitrov et al. |
| 5,589,153 | A | * | 12/1996 | Garces et al. ............ 423/705 |
| 5,780,876 | A | | 7/1998 | Hata |

(Continued)

FOREIGN PATENT DOCUMENTS

CN 1036414 10/1989

(Continued)

OTHER PUBLICATIONS

Melnik et al. "Properties of Free-Standing GaN Bulk Cyrstals Grown by HPVE", Mat. Res. Soc. Symp. Proc. vol. 482 (1998) pp. 269-274.*

(Continued)

*Primary Examiner*—Robert Kunemund
(74) *Attorney, Agent, or Firm*—Morrison & Foerster LLP

(57) ABSTRACT

The present invention provides a process for forming a bulk monocrystalline aluminum nitride by using a supercritical ammonia. The process comprises the steps of forming a supercritical solvent containing ions of an alkali metal in an autoclave; and dissolving a feedstock in this supercritical solvent to form a supercritical solution, and simultaneously or separately crystallizing aluminum nitride on the face of a crystallization seed. This process is carried out in the autoclave (1) which is provided with a convection-controller (2) arranged therein and which is to produce a supercritical solvent. The autoclave is set in a furnace unit (4) equipped with a heater (5) and/or a cooler (6).

32 Claims, 6 Drawing Sheets

U.S. PATENT DOCUMENTS

| | | | |
|---|---|---|---|
| 5,868,837 A | | 2/1999 | DiSalvo et al. |
| 5,928,421 A | * | 7/1999 | Yuri et al. .................... 117/97 |
| 6,051,145 A | | 4/2000 | Griffith et al. |
| 6,067,310 A | | 5/2000 | Hashimoto et al. |
| 6,139,628 A | | 10/2000 | Yuri et al. |
| 6,156,581 A | * | 12/2000 | Vaudo et al. ................. 438/22 |
| 6,177,057 B1 | | 1/2001 | Purdy |
| 6,270,569 B1 | | 8/2001 | Shibata et al. |
| 6,372,041 B1 | * | 4/2002 | Cho et al. .................... 117/84 |
| 7,081,162 B2 | | 7/2006 | Dwilinski et al. |
| 7,160,388 B2 | * | 1/2007 | Dwili ski et al. ............ 117/68 |
| 2001/0008656 A1 | * | 7/2001 | Tischler et al. ............ 428/34.1 |
| 2001/0022154 A1 | * | 9/2001 | Cho et al. ....................... 117/2 |
| 2002/0189531 A1 | | 12/2002 | Dwilinski et al. |
| 2004/0139912 A1 | | 7/2004 | Dwilinski |
| 2004/0244680 A1 | | 12/2004 | Dwilinski et al. |
| 2004/0255840 A1 | | 12/2004 | Dwilinski et al. |
| 2006/0032428 A1 | | 2/2006 | Dwilinski et al. |
| 2006/0037530 A1 | | 2/2006 | Dwilinski et al. |

FOREIGN PATENT DOCUMENTS

| | | |
|---|---|---|
| CN | 1289867 A | 4/2001 |
| CN | 1065289 C | 5/2001 |
| EP | 0 711 853 B1 | 5/1996 |
| EP | 0 716 457 A2 | 6/1996 |
| EP | 0711853 B1 * | 9/1999 |
| EP | 1 088 914 | 4/2001 |
| FR | 2 796 657 | 1/2001 |
| GB | 2 326 160 | 12/1998 |
| GB | 2 333 521 | 7/1999 |
| JP | 07-022692 B2 | 3/1995 |
| JP | 7-165498 | 6/1995 |
| JP | 8-250802 | 9/1996 |
| JP | 9-134878 | 5/1997 |
| JP | 09-293897 | 11/1997 |
| JP | 10-7496 | 1/1998 |
| JP | 10-70079 | 3/1998 |
| JP | 10-70338 | 3/1998 |
| JP | 410070079 A * | 3/1998 |
| JP | 11-54847 | 2/1999 |
| JP | 11-307813 | 11/1999 |
| JP | 2000-82863 | 3/2000 |
| JP | 2000-216494 | 8/2000 |
| JP | 2000-327495 | 11/2000 |
| JP | 2001-342100 | 12/2001 |
| JP | 2003040699 A | 2/2003 |
| JP | 2004168656 A | 6/2004 |
| WO | WO98/55671 | 12/1998 |
| WO | WO 01/24284 | 4/2001 |
| WO | WO 01/024921 | 4/2001 |
| WO | WO-02101120 A2 | 12/2002 |

OTHER PUBLICATIONS

Balkas et al. "Growth of Bulk AiN and GaN Single Crystals by Sublimation", Mat. Res. Soc. Symp. Proc. vol. 449 (1997) pp. 41-46.*
Porowski et al. "Bulk and Homeoepitaxial GaN-Growth and Characterisation", Journal of Crystal Growth, 189/190 (1998) pp. 153-158.*
*Preliminary Notice of Rejection of the IPO* (Translation), 3 pages.
Journal of Physics Condensed Matter, v13, n32, Aug. 13, 2001, pp. 6875-6892.
Physica Status Solidi (a) Applied Research, v180, n1, 2000, pp. 51-58.
PCT Form PCT/IB/338, Jul. 1996.
PCT Form PCT/IPEA/409, Jul. 1998.
Mao et al., "New Concept Technology Pressure Variation Liquid Phase Epitaxy", SPIE Photonics Taiwan Conference Proceeding, Jul. 2000, pp. 1-12.
Shin-ichi Hirano et al. (1989) "Hydrothermal Synthesis of Gallium Orthophosphate Crystals," Bull. Chem. Soc. Jpn. 62, pp. 275-278.
(1997). "Single Crystal Growth," Chapter 1 In Hydrothermal Synthesis Handbook. Gihodo Press, Second Edition, pp. 245-255.
R. A. Laudise (1991). "What is Materials Chemistry?". Chapter 27 In Materials for NonLinear Optics: Chemical Perspectives. American Chemical Society. pp. 410-433.
Noboru Sakagami et al. (1974) "Growth Kinetics and Morphology of ZnO Single Crystal Grown under Hydrothermal Conditions," *Journal of the Ceramic Association* 82, pp. 405-413.
T. Sekiguchi et al. (2000) "Hydrothermal Growth of ZnO Single Crystals and their Optical Characterization," *Journal of Crystal Growth* 214/215, pp. 72-76.
K. Yanagisawa et al. (1996) "Hydrothermal Single Growth of Calcite in Ammonium Acetate Solution," *Journal of Crystal Growth* 163, pp. 285-294.
K. Yanagisawa et al. (2001) "Improvement of Quality of Hydrothermally Grown Calcite Single Crystals," *Journal of Crystal Growth* 229, pp. 440-444.
S. Hirano (1991) "Growth of Gallium Orhophosphate Single Crystals in Acidic Hydrothermal Solutions," *Journal of Materials Science* 24, pp. 2805-2808.
Notification from Japanese Patent Office dated Mar. 29, 2005 and Submission of Printed Publication.
Chinese Office Action dated Apr. 8, 2005.
Akasaki, I. et al. (1991). "Growth and Properties of Single Crystalline GaN Films by Hydride Vapor Phase Epitaxy," *Crystal Properties and Preparation* 32-34:154-157.
Chu, T. L. et al. (1974). "Crystal Growth and Characterization of Gallium Nitride," *J. Electrochem. Soc.: Solid-State Science and Technology* 121-1:159-162.
Kaschner, A. et al. (1999). "Influence of Doping on the Lattice Dynamics of Gallium Nitride," *MRS Internet J. Nitride Semicond. Res.* 4S1, G3.57.
Kim, S. T. et al. (1998). "Preparation and Properties of Freestanding HVPE Grown GaN Substrates," *Journal of Crystal Growth* 194:37-42.
Kuroda, Naotaka et al. (1998). "Precise Control of Pn-junction Profiles for GaN-based LD structures Using GaN Substrates with Low Dislocation Densities," *Journal of Crystal Growth* 189/190:551-555.
Motoki, Kensaku et al. (2001). "Preparation of Large Freestanding GaN Substrates by Hydride Vapor Phase Epitaxy Using GaAs as a Starting Substrate," *J. Appl. Phys.* 40:L140-L143.
Office Action mailed Apr. 20, 2005, directed to U.S. Appl. No. 10/479,807.
D. Peters (1990) "Ammonothermal Synthesis of Aluminum Nitride," Journal of Crystal Growth 104, pp. 411-418.
M. K. Kelly et al. (1996) "Optical Patterning of GaN Films," *Apply. Phys. Lett.* 69(12), pp. 1749-1751.
W. S. Wong et al. (1999) "Fabrication of Thin-Film InGaN Light-Emitting Diode Membranes by Laser Lift-Off," *Applied Physics Letters* 75(10), pp. 1360-1362.
D. Ketchum, et al., "Crystal growth of gallium nitride in supercritical ammonia", *Journal of Crystal Growth*, vol. 222, Jul. 18, 2000.
R. Dwilinski, et al., "AMMONO method of GaN and AlN production", *Diamond and Related Materials*, vol. 7, May 18, 1998.
Yamane, Hisanori et al. (1998) "Morphology and Characterization of GaN Single Crystals Grown in a Na Flux," Journal of Crystal Growth 186, pp. 8-12.
Yamane, Hisanori et al. (1998) "Na Flux Growth of GaN Single Crystals," Journal of the Japanese Association for Crystal Growth 25(4), pp. 14-19, with partial English translation.
Notification from Japanese Patent Office mailed Mar. 14, 2006, directed to JP Application No. 2003-503867, with partial English translation.
R. Dwilinski et al., AMMONO method of GaN and AlN production, May 18, 1998, pp. 1348-1350.
Hisanori Yamane, Polarity of GaN Single Crystals Prepared with Na Flux, pp. 3436-3440.
Masichi Yano et al., Control of Nucleation Site and Growth Orientation of Bulk GaN Crystals.

R. Dwilinski et al., AMMO method of BN, AlN and GaN synthesis and crystal growth, pp. 1-4.

K. Pakula et al., Growth of GaN Metalorganic Chemical Vapour Deposition Layers on GaN Single Crystals, vol. 88 (1995), pp. 861-864.

R. Dwilinski et al. On GaN Crystallization by Ammonothermal Method, vol. 90(1996, pp. 763-766.

R. Dwilinski et al., Exciton plhoto-liminescence of GaN bulk crystals grown by the AMMONO method, (1997), pp. 46-49.

Douglas R. Ketchum et al., Crystal growth of gallium nitride in supercritical ammonia, (2001) pp. 431-434.

Yu Melnik et al., Properties of free-standing gan bulk crystals grown by hvpe, 1998, pp. 269-274.

C.M. Balkas et al., Growth of Bulk AlN and GaN Single Crystals by Sublimation, vol. 449 1997, pp. 41-46.

Sylwester Porowski, Bulk and homoepitaxial GaN-growth and characterisation, 1998, pp. 153-158.

Masato Aoki et al. Growth of GaN single crystals from a Na—Ga melt at 750 degreesC and 5Mpa of N2, 2000, pp. 7-12.

U.S. Office Action dated Nov. 14, 2006, directed at counterpart U.S. Appl. No. 10/682,891.

Japanese Office Action dated Dec. 26, 2006, directed at counterpart JP application No. 2003-544869.

Chinese Office Action dated Apr. 13, 2007, directed to counterpart CN application No. 02802023.5.

Porowski, S. (1996). "High pressure growth of GaN -- new prospects for blue lasers," *Journal of Crystal Growth* 166:583-589.

Polish Patent Office Notification dated Jan. 15, 2007, directed at corresponding Polish Application No. P-347918.

Polish Search Report dated Jan. 15, 2007, directed at corresponding Polish Application No. P-347918.

U.S. Office Action dated Mar. 21, 2007, directed at corresponding U.S. Appl. No. 10/479,857.

Penkala, Tadeusz. (1972). *Zarys krystalografii (Basics of Crystallography)*. PWN, ed., Warszawa: 349 and verified English translation.

N. IO. Ikornikova. (1975). *Hydrothermal synthesis of crystals in chloride systems*. Izd. Nakua, ed. Moscwa: 124-125; 132-133 and verified English translation.

Sangwal, Keshra, ed. (1994). "Growth apparatus" Chapter 10.3 *In Elementary Crystal Growth* . Lubin: 331.

Purdy, Andrew P. (1999). "Ammonothermal Synthesis of Cubic Gallium Nitride," *Chem. Mater.* 11:1648-1651.

Lan et al. (2000). "Syntheses and structure of nanocrystalline gallium nitride obtained from ammonothermal method using lithium metal as mineralizator," *Materials Research Bulletin* 35:2325-2230.

\* cited by examiner

METHOD AND EQUIPMENT FOR MANUFACTURING ALUMINUM NITRIDE BULK SINGLE CRYSTAL

TECHNICAL FIELD

The present invention relates to a process and an apparatus for growing a bulk monocystalline aluminum nitride by crystallizing from a supercritical solution on a crystallization seed. In particular, the invention pertains to a process for growing a bulk monocrystalline aluminum nitride by way of a technique of making use of a supercritical ammonia.

BACKGROUND ART

Optoelectronic devices based on nitrides are generally fabricated on sapphire or silicon carbide substrates which differ from nitride layers deposited thereon (so-called heteroepitaxy). However, qualities of such devices that have epitaxially grown on heterogeneous substrates are not sufficiecnt.

Therefore, there is a demand for a process for forming not only a bulk monocystalline GaN but also a bulk monocystalline AlN. The following are proposed as the process for forming bulk mono-crystalline GaN: Halide Vapor Phase Epitaxy (HVPE) employing halides in vapor phases ["Optical patterning of GaN films", M. K. Kelly, O. Ambacher, Appl. Phys. Lett. 69 (12) (1996) and "Fabrication of thin-film InGaN light-emitting diode membranes" W. S. Wrong, T. Sands, Appl. Phys. Lett. 75 (10) (1999)]; the HNP process using high-pressure nitrogen ["Prospects for high-pressure crystal growth of III–V nitrides", S. Porowski et al., Inst. Phys. Conf. Series, 137, 369 (1998)]; the ammono method using supercritical ammonia so as to lower the temperature and the pressure for a growing step ["ammono method of BN, AlN, and GaN synthesis and crystal growth" R. Dwilinski et al., Proc. EGW-3, Warsaw, Jun. 22–24, 1998, MRS Internet Journal of Nitride Semiconductor Research]; and ["Crystal Growth of gallium nitride in supercritical ammonia", J. W. Kolis et al., J. Cryst. Growth 222, 431–434 (2001)].

On the other hand, as for bulk monocrystalline AlN, D. Peters has proposed a process for forming aluminum nitride crystals from metallic aluminum by using a supercritical ammonia (Journal of Crystal Growth 104 (1990), pp 411–418), however, the resultant crystals were very fine and only for use in packages. Recently, as an epitaxial growth method, Y. Shi et al. have succeeded in growing monocrystalline AlN on a SiC substrate through an AlN buffer layer by the sublimation method (MIJ-NSR, Vol. 6, Art. 5). However, improvement on the quality of crystals is limited, since the vapor phase growth is based on non-equilibrium chemical reaction. In the meantime, the lives of optics using semiconductors vary depending on mainly the crystallinity of the active layers, involving a dislocation density. In case of a laser diode employing an AlN substrate, it is preferable that the dislocation density thereof is decreased to $10^6/cm^2$ or lower, which is, however, very hard for the conventional processes to achieve.

DISCLOSURE OF INVENTION

An object of the present invention is, therefore, to provide a process and an apparatus for forming a bulk monocrystalline aluminum nitride on a crystallization seed.

Another object of the present invention is to grow a bulk crystal of a nitride as a substrate for optical devices in order to improve the quality of the optical devices.

These objects are achieved by a process of growing bulk monocrystalline aluminum nitride, which comprises the steps of dissolving a feedstock in a supercritical solvent containing alkali metal ions in an autoclave to form a supercritical solution, and crystallizing aluminum nitride on the face of a crystallization seed from the supercritical solution, at a temperature higher than the dissolution temperature or under a pressure lower than the dissolution pressure.

The first condition for achieving the above objects is to provide an ammono-basic growth of crystals where a chemical transport is carried out in a supercritical ammonia solvent containing at least one mineralizer for imparting an ammono-basic property, thereby monocrystalline aluminum nitride being grown: that is, it relates to a process for forming a bulk monocrystalline aluminum nitride, comprising the steps of dissolving an aluminum-containing feedstock in a supercritical solvent containing ammonia and alkali metal ions in an autoclave, so as to form a supercritical solution containing aluminum nitride whose solubility has a negative temperature coefficient; and selectively crystallizing aluminum nitride only on the face of a crystallization seed arranged in the autoclave, from the above supercritical solution introduced, by taking advantage of the negative temperature coefficient of the solubility of aluminum nitride.

Also, the present invention relates to a process for forming a bulk monocrystalline aluminum nitride, which comprises the steps of dissolving an aluminum-containing feedstock in a supercritical solvent containing ammonia and alkali metal ions in an autoclave, so as to form a supercritical solution containing aluminum nitride whose solubility has a positive pressure coefficient, and selectively crystallizing aluminum nitride only on the face of a crystallization seed arranged in the autoclave, from the above supercritical solution introduced, by taking advantage of the positive pressure coefficient of the solubility of aluminum nitride.

In the step of introducing the supercritical solution containing aluminum nitride in the first invention, aluminum nitride as a raw material does not exist in nature, differently from the hydrothermal synthesis of quartz crystal. The present invention, therefore, employs AlN which is synthesized by the HVPE process or other chemical process, or the oxidation-reduction process or the nitriding process for aluminum oxide. Particularly, a sintered body of AlN powder is favorable feedstock because such powder can provide very high packing density.

In the first invention, it is essential that the second step of crystallization should be carried out selectively on the face of the crystallization seed. Therefore, the second invention is a process for forming a bulk monocrystalline aluminum nitride, characterized in that the aluminum-containing feedstock is dissolved in the supercritical solvent containing ammonia and alkali metal ions, so as to form the supercritical solution of aluminum nitride whose solubility has a negative temperature coefficient; that the solubility of the supercritical solution is adjusted below a certain concentration which does not allow spontaneous crystallization, while maintaining oversaturation of the supercritical solution relative to a crystallization seed, by raising the temperature to a predetermined temperature or reducing the pressure to a predetermined pressure, at least in a zone where the crystallization seed is arranged; and that aluminum nitride is crystallized and selectively grown only on the face of the crystallization seed arranged in the autoclave.

In the second invention, it is preferable that, in the case where two zones, i.e., the dissolution zone and the crystallization zone are simultaneously formed in the autoclave, the oversaturation of the supercritical solution relative to the crystallization seed is maintained by controlling the dissolution temperature and the crystallization temperature. The control is found to be easy by setting the temperature of the crystallization zone at a temperature of 400 to 600° C., and by maintaining the difference in temperature between the dissolution zone and the crystallization zone within the autoclave, to 150° C. or less, preferably 100° C. or less. Preferably, the adjustment of the oversaturation of the supercritical solution relative to the crystallization seed is made by providing one or more baffles for dividing the internal of the autoclave into a lower temperature dissolution zone and a higher temperature crystallization zone and controlling the convection between the dissolution zone and the crystallization zone. Further, in the case where two zones, i.e., a dissolution zone and a crystallization zone, between which a specified temperature difference is set, are formed in the autoclave, the oversaturation of the supercritical solution relative to the crystallization seed is preferably adjusted by using an aluminum-containing feedstock composed of an AlN crystal having a total surface area larger than the total surface area of the crystallization seed.

In the first invention, the above alkali metal ions are added in the form of an alkali metal or a mineralizer containing no halogen, and the alkali metal ions are of at least one selected from the group consisting of $Li^+$, $Na^+$ and $K^+$. The aluminum-containing feedstock to be dissolved in the supercritical solvent is preferably aluminum nitride, or otherwise, it may be an aluminum precursor which can produce an aluminum compound soluble in the supercritical solution.

The process of the present invention is based on an ammonobasic reaction. The aluminum-containing feedstock may be either AlN formed by HVPE or AlN formed by a chemical reaction, which originally contains, for example, chlorine, in so far as the ammonobasic supercritical reaction is not hindered.

In the case where the second invention is employed, aluminum nitride or its precursor which can be dissolved in the supercritical ammonia solvent through an equilibrium reaction is used as the feedstock. Aluminum nitride or its precursor may be used in combination with metallic aluminum which irreversibly reacts with the supercritical ammonia solvent, although the addition of an excessive amount of such metallic aluminum should be avoided so as not to hinder the equilibrium reaction for crystallization.

Since the use of aluminum nitride as the feedstock allows an equilibrium reaction, the control of the reaction for crystallization is easy. In this case, AlN monocrystal is used as the crystallization seed, and it is preferable to use a high quality crystallization seed so as to allow the selective growth.

The present invention provides a third process for concurrently and separately carrying out the above first dissolution step and the above second crystallization step in an autoclave. That is, the third invention relates to a process for forming a bulk monocrystalline aluminum nitride, which comprises the steps of forming a supercritical ammonia solvent containing alkali metal ions in the autoclave, dissolving an aluminum-containing feedstock in the supercritical ammonia solvent, and crystallizing aluminum nitride on the face of a crystallization seed, from the supercritical solution of the feedstock, under the conditions of a higher temperature and/or a lower pressure than the temperature and/or the pressure found while the aluminum-containing feedstock is dissolved in the supercritical solvent.

In the third invention, it is preferable that, separately from the step of dissolving the aluminum-containing feedstock, a step of moving the supercritical solution to a higher temperature and/or a lower pressure zone is provided. At least two zones between which a temperature difference arises are simultaneously formed in the autoclave, and the aluminum-containing feedstock is located in the lower temperature dissolution zone, and the crystallization seed is located in the higher temperature crystallization zone. It is necessary that the difference in temperature between-the dissolution zone and the crystallization zone should be set within such a range that a chemical transport in the supercritical solution can be ensured and can be carried out mainly by convection. The difference in temperature therebetween is generally 1° C. or more, preferably 5 to 150° C., more preferably 100° or less.

In the present invention, aluminum nitride may contain a donor, an acceptor, or a magnetic dopant, as required. As will be defined later, the supercritical solvent contains $NH_3$ or a derivative thereof. The mineralizer contains alkali metal ions, at least, ions of sodium or potassium. On the other hand, the aluminum-containing feedstock is mainly composed of aluminum nitride or a precursor thereof. The precursor is selected from an azide, imide, amidoimide, amide, hydride or the like, each of which contains aluminum, and it will be defined later.

In the present invention, it is preferable to use AlN as a crystallization seed, the crystallization seed may have a hexagonal system or rhombohedral structure and has a close lattice constant, and contains no oxygen. It is preferable to use such as a monocrystal of SiC, GaN or the like. It is preferable to use a crystallization seed having a surface dislocation density of $10^6/cm^2$ or less. As other type crystallization seed, it is possible to use a heterogeneous substrate such as a conductive substrate on which AlN can be crystallized and wide applications can be realized. Such other crystallization seed is selected from a body-centered cubic crystal system Mo or W having a lattice constant of 2.8 to 3.6 on the $a_0$ axis, a hexagonal closest packing crystal system $\alpha$-Hf or $\alpha$-Zr, a tetragonal system diamond, a WC structure crystal system WC or $W_2C$, a ZnO structure crystal system $\alpha$-SiC, TaN, NbN or AlN, a hexagonal (P6/mmm) system $AgB_2$, $AuB_2$ or $HFB_2$, and a hexagonal ($P6_3$/mmc) system $\gamma$-MoC or $\epsilon$-MbN. The body-centered cubic crystal system Mo or W is cut from the direction [1, 1, 1] for use as a crystallization seed.

In the present invention, the crystallization of aluminum nitride is carried out at a temperature of 100 to 800° C., preferably 400 to 600° C. Also, the crystallization of aluminum nitride is carried out under a pressure of 100 to 10,000 bars, preferably 1,000 to 5,500 bars, more preferably 1,500 to 3,000 bars.

The concentration of alkali metal ions in the supercritical solvent is so adjusted as to ensure the specified solubilities of the feedstock and aluminum nitride, and the molar ratio of the alkali metal ions to other components of the resultant supercritical solution is controlled within a range from 1:200 to 1:2, preferably from 1:100 to 1:5, more preferably from 1:20 to 1:8.

In this regard, the present invention relates to a technique of an ammono-basic growth of a crystal which comprises the steps of causing a chemical transport in a supercritical ammonia solvent containing at least one mineralizer for imparting an ammono-basic property, thereby growing a monocrystalline aluminum nitride. This technique has a very high originality, and therefore, the terms herein used should be understood as having the meanings defined as below in the present specification.

The term "aluminum nitride" refers to aluminum nitride which may contain impurities to an extent that the above technique of the ammono-basic growth of crystal is not hindered.

The term "bulk monocrystalline aluminum nitride" refers to a monocrystalline aluminum nitride substrate on which an optoelectronic device such as LED or LD can be formed by an epitaxial growing process such as MOCVD, HVPE or the like. In the case where such a device is fabricated on a sapphire substrate, the existence of a buffer layer is essential. However, the use of an AlN substrate makes it possible to grow a high quality vapor phase film without a buffer layer. The AlN substrate obtained by the process of the present invention has the full width at half maximum of 2 minutes (120 arcsecs.) or less, preferably one minute or less. As compared with AlN which is grown on a sapphire substrate and which has the full width at half maximum of 4 minutes, the quality of the AlN substrate of the present invention is highly improved.

In addition, the AlN substrate absorbs light with a wavelength of 200 nm or longer. In contrast, a GaN substrate absorbs light with a wavelength of 356 nm within the short wavelength zone. Accordingly, it is expected to use the AlN substrate as a substrate for UV-LED in order to enhance light output. Further, the AlN substrate has a higher heat dissipation property and thus is suitable for use in a power device. Furthermore, the use of the AlN substrate makes it possible to grow a highly mixed crystal of AlGaN, and if used in a laser device, the confinement in the vertical direction is improved.

The term "a precursor of aluminum nitride" refers to a substance which contains at least aluminum, and if needed, an alkali metal, an element of the Group XIII, nitrogen and/or hydrogen, or a mixture thereof, and examples of such a precursor includes metallic Al, an alloy or an intermetallic compound of Al, and a hydride, amide, imide, amidoimide or azide of Al, which is used as a substitutive feedstock for aluminum nitride, and which can form an aluminum compound soluble in a supercritical ammonia solvent as defined below.

The term "aluminum-containing feedstock" refers to aluminum nitride or a precursor thereof.

The term "supercritical ammonia solvent" refers to a supercritical solvent which contains at least ammonia, and ions of at least one alkali metal for dissolving aluminum nitride.

The term "mineralizer" refers to a supplier for supplying ions of at least one alkali metal for dissolving aluminum nitride in the supercritical ammonia solvent, and specific examples thereof are described in the present specification.

The phrase "the dissolution of the aluminum-containing feedstock" refers to a reversible or irreversible process in which the above feedstock takes the form of an aluminum compound soluble in the supercritical solvent such as an aluminum complex compound. The aluminum complex compound means a complex compound in which an aluminum as a coordination center is surrounded by ligands, e.g., $NH_3$ or derivatives thereof such as $NH_2^-$ and $NH^{2-}$.

The term "supercritical ammonia solution" refers to a soluble aluminum compound which is formed by the dissolution of the aluminum-containing feedstock in the supercritical ammonia solvent. Based on our experiences, we can anticipate that there will be an equilibrium relationship between solid aluminum nitride and the supercritical solution under a sufficiently high temperature and pressure atmosphere. Accordingly, the solubility of the soluble aluminum nitride can be defined as an equilibrium concentration of the above soluble aluminum compound in the presence of solid aluminum nitride. In such a process, it is possible to shift this equilibrium according to change in temperature and/or pressure.

The phrase "negative temperature coefficient of the solubility" means that the solubility is expressed by a monotonically decreasing function of the temperature, when all other parameters are kept constant. Similarly, the phrase "positive pressure coefficient of the solubility" means that the solubility is expressed by a monotonically increasing function of the pressure, when all other parameters are kept constant. In this regard, we are now supposing that the solubility of aluminum nitride in the supercritical ammonia solvent, at least, has a negative temperature coefficient and a positive pressure coefficient within a range of 400 to 600° C. and within a range of 1 to 5.5 Kbars, respectively.

The phrase "the oversaturation of the supercritical ammonia solution relative to aluminum nitride" means that the concentration of the soluble aluminum compound in the above supercritical ammonia solution is higher than a concentration in an equilibrium state, i.e., the solubility of aluminum nitride. In case of the dissolution of aluminum nitride in a closed system, such oversaturation can be achieved, according to a negative temperature coefficient or a positive pressure coefficient of the solubility, by raising the temperature or reducing the pressure.

The phrase "the chemical transport of aluminum nitride in the supercritical ammonia solution" means a sequential process including the dissolution of the aluminum-containing feedstock or aluminum nitride, the shift of the soluble aluminum compound or complex compound through the supercritical ammonia solution, and the crystallization of aluminum nitride from the oversaturated supercritical ammonia solution. In general, a chemical transport process is carried out by a certain driving force such as a temperature gradient, a pressure gradient, a concentration gradient, difference in chemical or physical properties between a dissolved feedstock and a crystallized product, or the like. Preferably, the chemical transport in the process of the present invention is achieved by carrying out the dissolution step and the crystallization step in separate zones, on condition that the temperature of the crystallization zone is maintained higher than that of the dissolution zone so that a bulk monocrystalline aluminum nitride can be obtained by the process of this invention.

The term "crystallization seed" has been described by way of examples in the present specification. The crystallization seed provides a zone on which the crystallization of aluminum nitride is allowed to take place, and the growth quality of the crystal depends on the crystallization seed. Thus, the type of crystallization seed is selected from such crystals that are analogous to a crystal to be grown and have good qualities.

The term "spontaneous crystallization" refers to an undesirable phenomenon in which the formation and the growth of the core of aluminum nitride from the oversaturated supercritical ammonia solution occur at any site inside the autoclave, and the spontaneous crystallization also includes disoriented growth of the crystal on the surface of the crystallization seed. If other parameters are kept constant, such a tendency is observed that, with a rise in temperature, the limit in spontaneous crystallization lowers together with the limit in dissolution, as shown in FIG. 9.

The term "selective crystallization on the crystallization seed" means a step of allowing the crystallization to take place on the crystallization seed, accompanied by substantially no spontaneous growth. This selective crystallization on the crystallization seed is essential for the growth of a bulk monocrystal, and it is one of the methods of the present invention.

The autoclave to be used in the present invention is a closed system reaction chamber for carrying out the ammono-basic growth of the crystal, and it may be in any form. AlN pellets to be used in the present invention are prepared by molding the powder of AlN into pellets and baking them. Pellets of this type having a very high density of, for example, 99.8% are commercially available.

In this regard, the temperature distribution in the autoclave as will be described later in the part of Examples is determined by using the autoclave empty inside without the supercritical ammonia, and thus, the supercritical temperature is not one actually measured. On the other hand, the pressure in the autoclave is directly measured, or it is determined by the calculation from the amount of ammonia firstly introduced, and the temperature and the volume of the autoclave.

It is preferable to use an apparatus as described below, to carry out the above process. The present invention provides an apparatus for forming a bulk monocrystalline aluminum nitride which comprises an autoclave (1) for producing a supercritical solvent, a convection-controller (2) arranged in the autoclave, and a furnace unit (4) equipped with a heater (5) or a cooler (6), in which the autoclave is set.

The furnace unit (4) includes a higher temperature zone equipped with a heater (5) which corresponds to a crystallization zone (14) in the autoclave (1), and a lower temperature zone equipped with a heater (5) or a cooler (6) which corresponds to a dissolution zone (13) in the autoclave (1); or otherwise, the furnace unit (4) includes a higher temperature zone equipped with a heater (5) or a cooler (6) which corresponds to a crystallization zone (14) in the autoclave (1), and a lower temperature zone equipped with a heater (5) or a cooler (6) which corresponds to a dissolution zone (13) in the autoclave (1). The convection controller (2) is composed of at least one horizontal baffle (12) which has a hole at the center or at its periphery and which partitions the crystallization zone (14) from the dissolution zone (13). Inside the autoclave (1), a feedstock (16) is set in the dissolution zone (13), and a crystallization seed (17) is set in the crystallization zone (14), and the convection of a supercritical solution between the zones (13) and (14) is controlled by the controller (2). It is to be noted that the dissolution zone (13) is located above the horizontal baffle (12), and the crystallization zone (13), below the baffle (12).

BEST MODE FOR CARRYING OUT THE INVENTION

Figure 1:
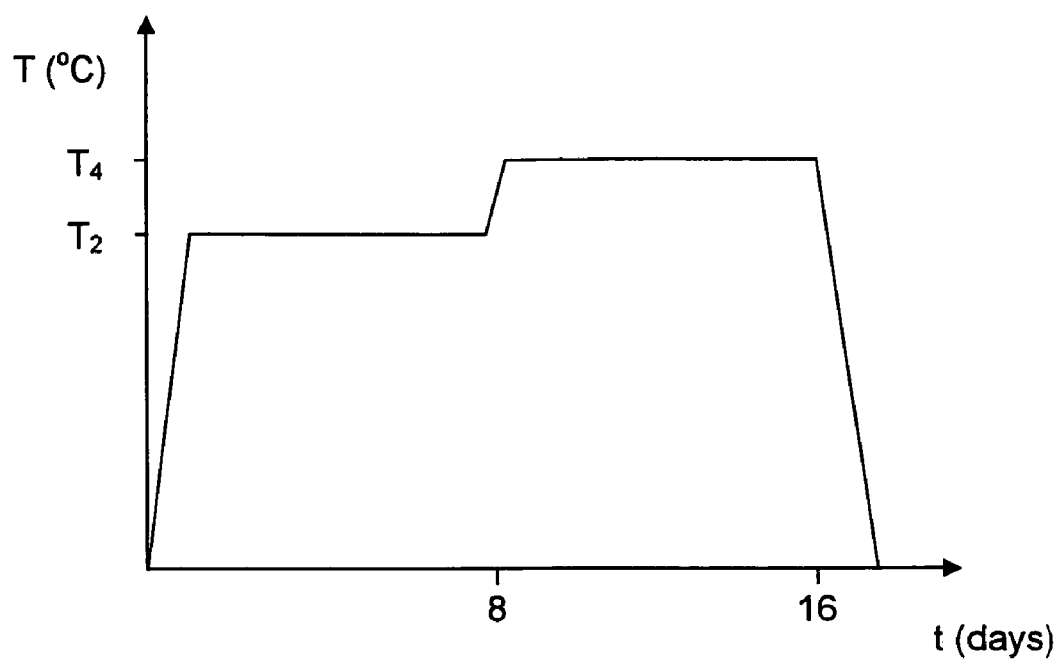
FIG. 1 shows a graph illustrating a change in temperature in an autoclave with the passage of time, on condition that the pressure is kept constant, in case of Example (1).

The process of the present invention is divided into two steps, that is., a step of dissolving a feedstock, and a step of moving a supercritical solution to a higher temperature zone or a lower pressure zone where the crystallization and growth of aluminum nitride on the face of a crystallization seed is carried out. Otherwise, it is also possible to divide the autoclave into at least two zones which differ in temperature from each other, and to set an aluminum-containing feedstock in a lower temperature dissolution zone, and a crystallization seed, in a higher temperature crystallization zone. The difference in temperature between the dissolution zone and the crystallization zone is selected within such a range that a chemical transport in the supercritical solution can be caused by convection. In this case, the difference in temperature between the dissolution zone and the crystallization zone is 1° C. or more. Aluminum nitride may contain a donor, an acceptor, a magnetic dopant, etc. As a supercritical solvent, ammonia ($NH_3$) or its derivative containing ions of alkali metals (at least potassium) may be used. As a feedstock, aluminum nitride or a precursor of AlN selected from an azide, an imide, an amidoimide, an amide and a hydride thereof may be used. The crystallization seed has a crystalline layer of a nitride which contains, at least, aluminum or other element of Group No. 13 (IUPAC, 1989) and preferably has a surface dislocation density of $10^6/cm^2$ or less.

The crystallization of aluminum nitride is carried out under the conditions where the temperature is from 400 to 600° C., and the pressure, from 1,500 to 3,000 bars, while the concentration of alkali metal ions in the supercritical solvent is so controlled that appropriate solubility of the feedstock and aluminum nitride can be ensured, and the molar ratio of the alkali metal ions to other components in the supercritical solvent is controlled within a range of from 1:200 to 1:2.

The apparatus for forming a monocrystalline aluminum nitride comprises an autoclave equipped with a convention controller, which is to produce a supercritical solvent; and at least one furnace unit equipped with a heater and/or a cooler, in which the autoclave is set. The furnace unit includes a higher temperature zone equipped with a heater which corresponds to the crystallization zone in the autoclave, and a lower temperature zone equipped with a heater and/or a cooler which corresponds to the dissolution zone in the autoclave. It is also possible to use a furnace unit which includes a higher temperature zone equipped with a heater and/or a cooler, and a lower temperature zone equipped with a heater and/or a cooler. The convection controller is composed of at least one horizontal baffle having a hole at the center or its periphery so as to partition the crystallization zone from the dissolution zone. Thus, the feedstock is set in the dissolution zone, and the crystallization seed, in the crystallization zone, in the autoclave. The convection of the supercritical solution between the dissolution zone and the crystallization zone is controlled by the above controller. The dissolution zone is located above the horizontal baffle, and the crystallization zone, below the horizontal baffle.

An obtainable best bulk monocrystalline AlN has a surface dislocation density of about $10^4/cm^2$, and the full width at half maximum of the X-ray from the surface (0002) of 60 arcsec. or less. A semiconductor device using such a bulk monocrystalline AlN can ensure a proper quality and a proper lifetime.

AlN shows a good solubility in ammonia ($NH_3$) containing an alkali metal or a compound thereof ($KNH_2$ or the like). When the solubility of AlN in the supercritical solvent is expressed by a function of temperature of 400 to 600° C. and a pressure of 1.0 to 3.5 kbars, the solubility is a monotonically increasing function of the pressure (a positive pressure coefficient), and also a monotonically decreasing function of the temperature (a negative temperature coefficient) in the supercritical ammonia solution which contains alkali metal ions at a predetermined molar concentration. By making use of this relationship, aluminum nitride is dissolved under a condition where the solubility becomes higher, and aluminum nitride is crystallized under a condition where the solubility becomes lower, so that a bulk monocrystalline AlN can grow. This negative temperature coefficient indicates that, if a difference in temperature arises, the chemical transport of aluminum nitride is carried out from the lower temperature dissolution zone to the higher temperature crystallization zone. In this regard, other aluminum compounds also can be used as a supply source of AlN complex. Next, an oversaturated solution relative to aluminum nitride is formed by appropriately changing the conditions, for example, by heating, so that a crystal is grown on the face of a crystallization seed. The process of the present invention makes it possible to grow a bulk monocrystalline aluminum nitride on the face of a crystallization seed, which leads to stoichiometric growth of AlN obtained as a bulk monocrystalline layer on a crystallization seed of AlN, SiC or the like. The above monocrystal is grown in the supercritical solution containing alkali metal ions, and therefore, the resultant monocrystal also contains 0.1 ppm or more of alkali metal. In addition, to maintain the basic property of the supercritical solution in order to prevent the corrosion of the apparatus, no halide may be intentionally added to the solvent. Further, the bulk monocrystalline AlN may be doped with a donor (e.g., Si, O, etc.), an acceptor (e.g., Mg, Zn, etc.) and a magnetic substance (e.g., Mn, Cr, etc.) at a concentration of $10^{17}$ to $10^{21}/cm^3$. The optical, electrical and magnetic characteristics of aluminum nitride can be changed by this doping. As other physical properties, the grown bulk monocrystalline AlN has a surface dislocation density of $10^6/cm^2$ or less, preferably $10^5/cm^2$ or less, more preferably $10^4/cm^2$ or less, and also has the full width at half maximum of the X-ray from the surface (0002) of 600 arcsec. or less., preferably 300 arcsec. or less, more preferably 60 arcsec. or less. It is possible to grow a bulk monocrystalline AlN as the best which has a surface dislocation density of about $10^4/cm^2$ or less, and the full width at half maximum of the X-ray from the surface (0002) of 60 arcsec. or less.

EXAMPLES

Two crucibles are set in a high-pressure autoclave having a volume of 10.9 $cm^3$. The autoclave is constructed according to a known design [H. Jacobs, D. Schmidt, Current Topics in Material Science, vol. 8, ed. E. Kaldis (North-Holland, Amsterdam, 1981), 381].

An AlN thin plate produced by HVPE or a sintered body of AlN powder (available from Tokuyama Soda) is used as a feedstock.

AlN, GaN or SiC produced by HVPE is used as a crystallization seed.

The formation of a supercritical ammonia solution and the crystallization therefrom are carried out by the following methods, in which temperatures $T_2$ to $T_5$ are set at a temperature of 400 to 600° C., except for temperature $T_1$.

(1) Metallic potassium having a purity of 4N (0.72 g) is added to the autoclave, and then, ammonia (4.81 g) is added thereto. The autoclave is closed to form a supercritical ammonia solution by controlling the temperature (FIG. 1). The autoclave is heated to $T_2$ so that the pressure in the autoclave is increased to 2 kbars. Several days after, the temperature of the autoclave is heated to $T_4$ while the pressure is kept at 2 kbars, and the autoclave in this state is left to stand alone for several days for crystallization (FIG. 1).

Figure 2:
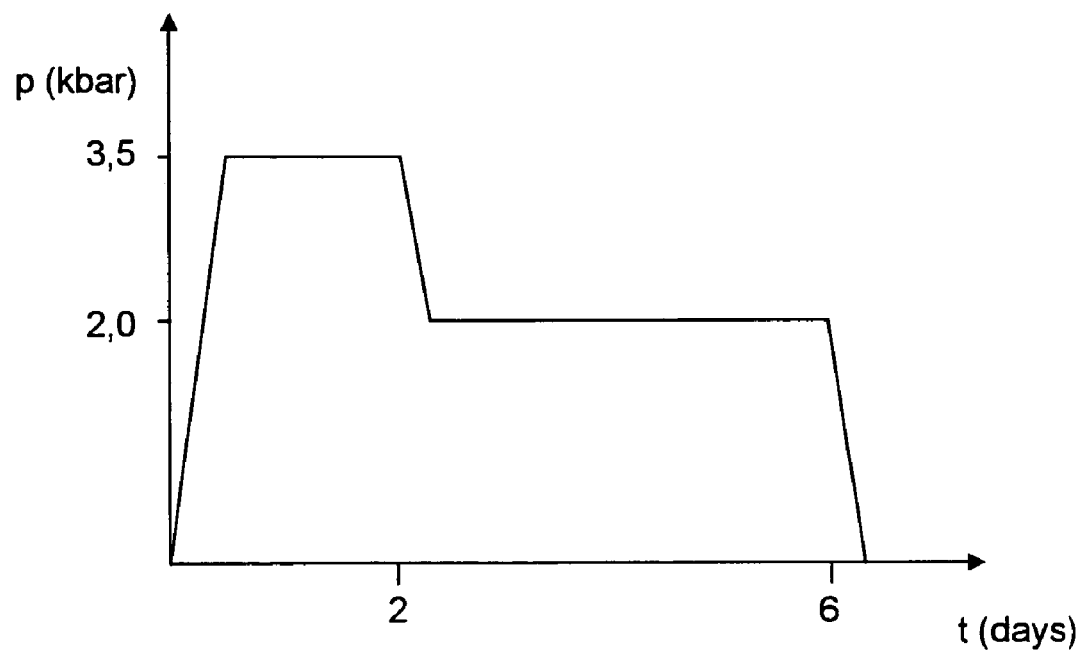
FIG. 2 shows a graph illustrating a change in pressure in an autoclave with the passage of time, on condition that the temperature is kept constant, in case of Example (2).

(2) Metallic potassium having a purity of 4N (0.82 g) is added to the autoclave, and then, ammonia (5.43 g) is added thereto. The autoclave is closed, and set in the furnace. A supercritical ammonia solution is formed by heating the autoclave to 500° C., while increasing the internal pressure therein to 3.5 kbars. Several days after, the pressure is reduced to 2 kbars while the temperature is kept at 500° C. The autoclave in this state is left to stand alone for several days for crystallization (FIG. 2).

Figure 3:
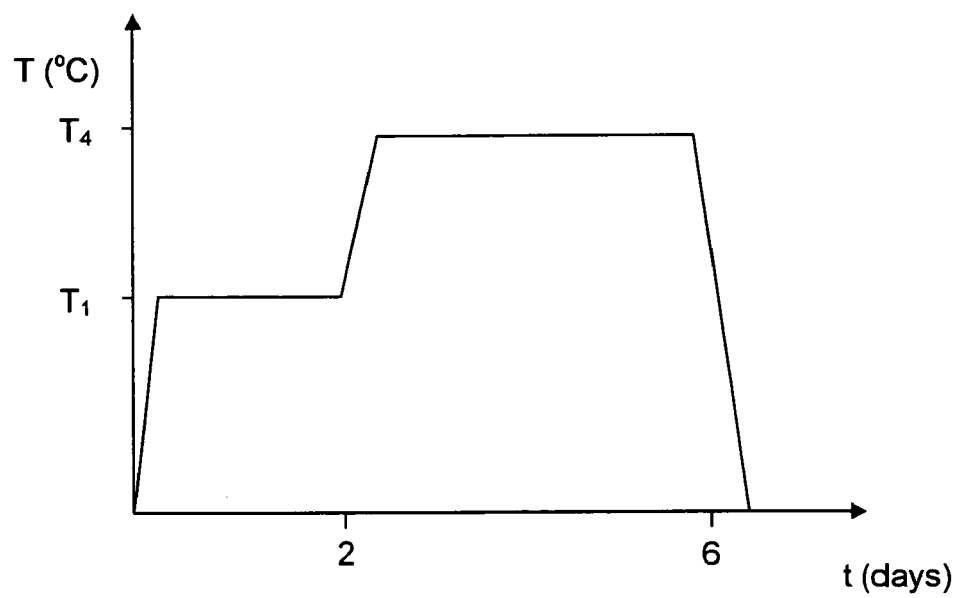
FIG. 3 shows a graph illustrating a change in temperature in an autoclave with the passage of time, on condition that the volume is kept constant, in case of Example (3).

(3) Metallic potassium having a purity of 4N (0.6 g) is added to the autoclave, and then, ammonia (4 g) is added thereto. The autoclave is closed, and set in the furnace. A supercritical ammonia solution is formed by heating the autoclave to $T_1$. Two days after, the temperature is raised to 500° C. while the pressure is set at 2 kbars. The autoclave in this state is left to stand alone for 4 days for crystallization (FIG. 3).

Figure 4:
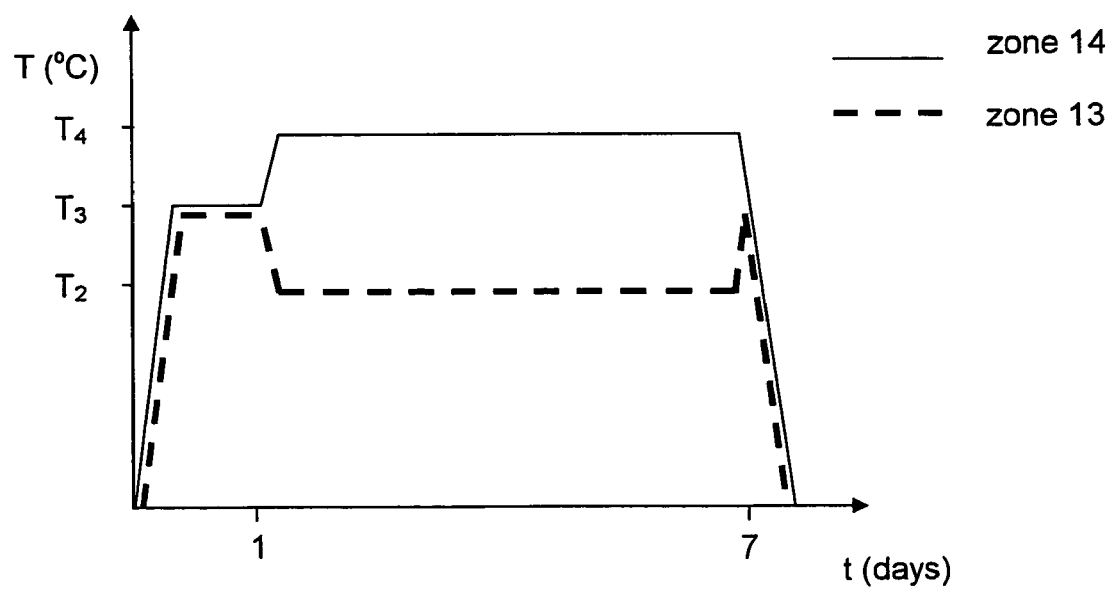
FIG. 4 shows a graph illustrating a change in temperature in an autoclave with the passage of time, in case of Example (4).
Figure 6:
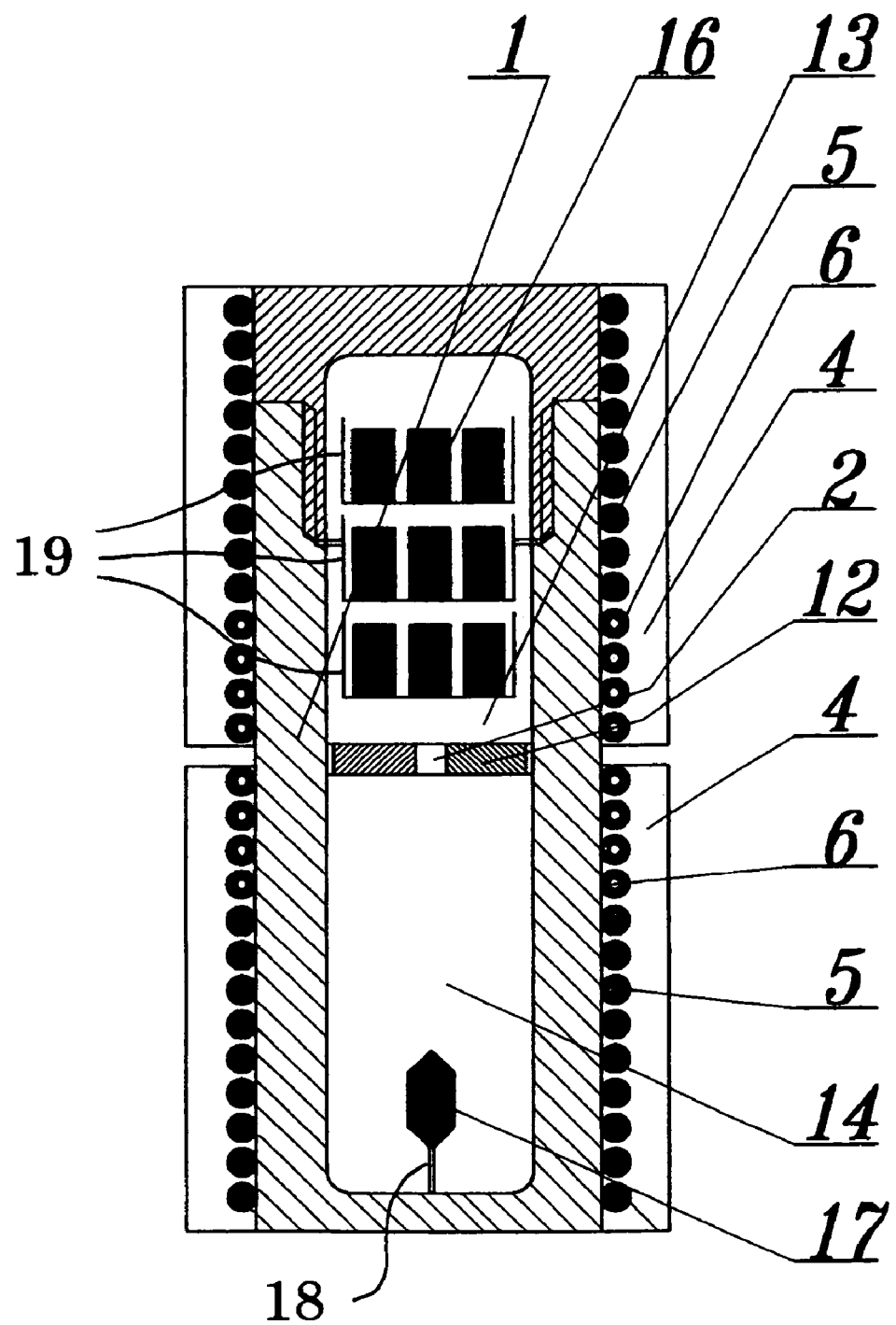
FIG. 6 is a schematic sectional view of an autoclave and a furnace unit used in Examples.
Figure 7:
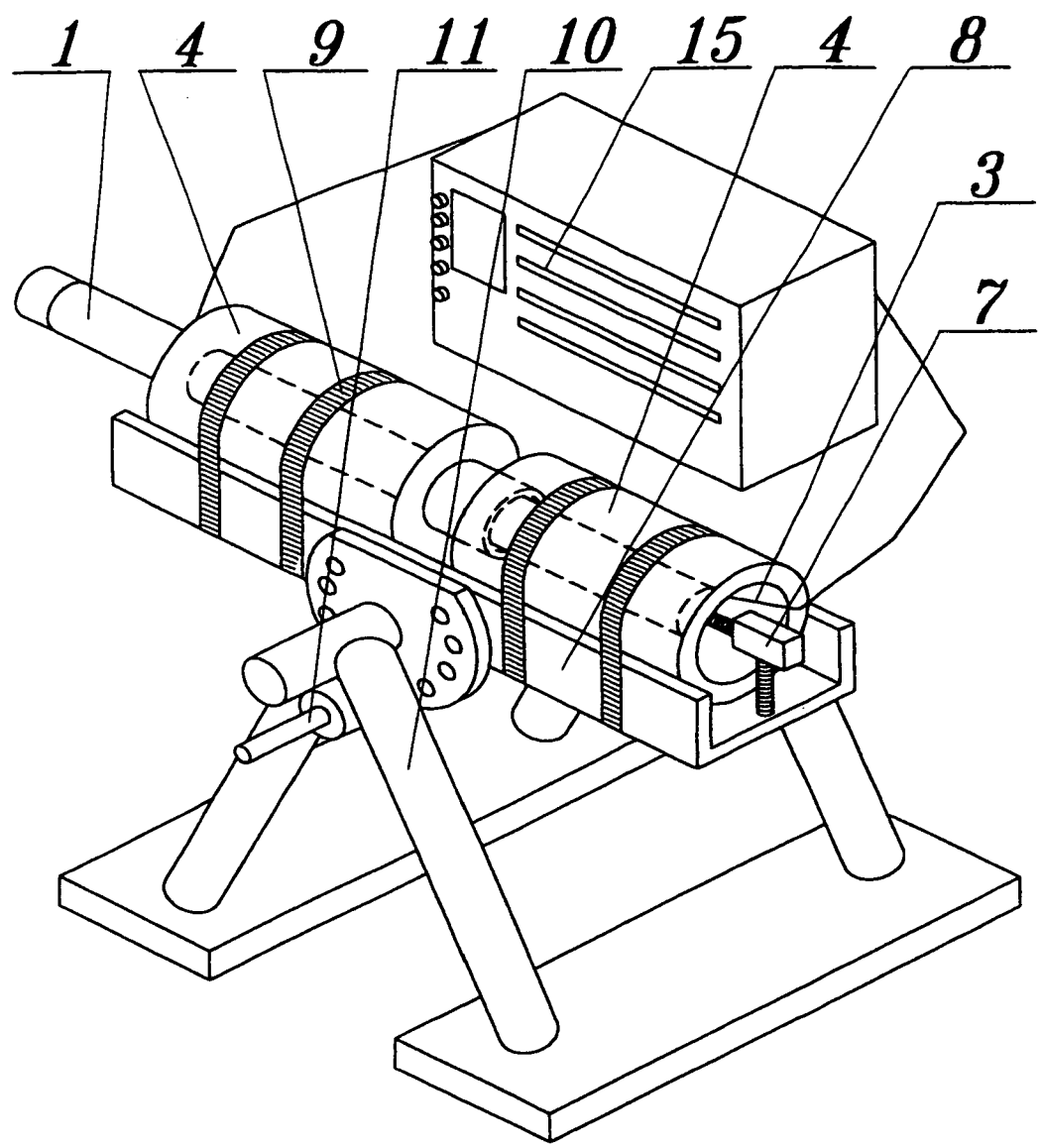
FIG. 7 is a schematic perspective view of an apparatus for forming a bulk monocrystalline aluminum nitride.

(4) AlN obtained by HVPE is divided into two same portions, which are then set in a dissolution zone (13) and a crystallization zone (14) in a high-pressure autoclave (1) having a volume of 35.6 $cm^3$, respectively (FIG. 6). Then, metallic potassium having a purity of 4N (2.4 g) is added to the autoclave, followed by the addition of ammonia (SN) (15.9 g) The autoclave (1) is closed and set in the furnace units (4). The autoclave (1) is heated to $T_3$ while the internal pressure is increased to about 2 kbars. One day after, the temperature of the crystallization zone (14) is raised to $T_4$, while the temperature of the dissolution zone (13) is lowered to $T_2$. The autoclave (1) in this state is left to stand alone for 6 days (FIG. 4).

Figure 5:
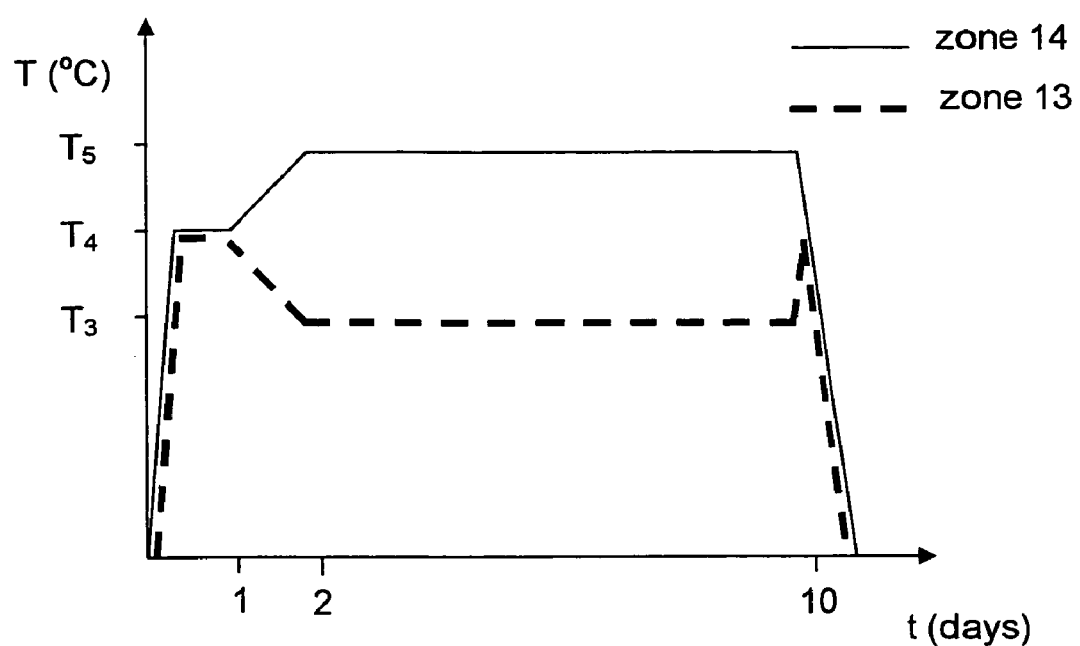
FIG. 5 shows a graph illustrating a change in temperature in an autoclave with the passage of time, in case of Example (5).

(5) A feedstock of AlN obtained by HVPE is set in a dissolution zone (13) in a high-pressure autoclave (1) having a volume of 36 $cm^3$ (FIG. 6). Metallic potassium having a purity of 4N (0.47 g) is added to the autoclave. A crystallization seed of AlN obtained by the same HVPE is set in a crystallization zone (14). Then, ammonia (5N) (16.5 g) is added to the autoclave (1). The autoclave (1) is closed and set in the furnace unit (4) and heated to $T_4$. The pressure in the autoclave (1) is about 3 kbars. One day after, the temperature of the dissolution zone (13) is lowered to $T_3$, while the temperature of the crystallization zone (14) is raised to $T_5$. The autoclave in this state is left to stand alone for 8 days (FIG. 5).

Figure 8:
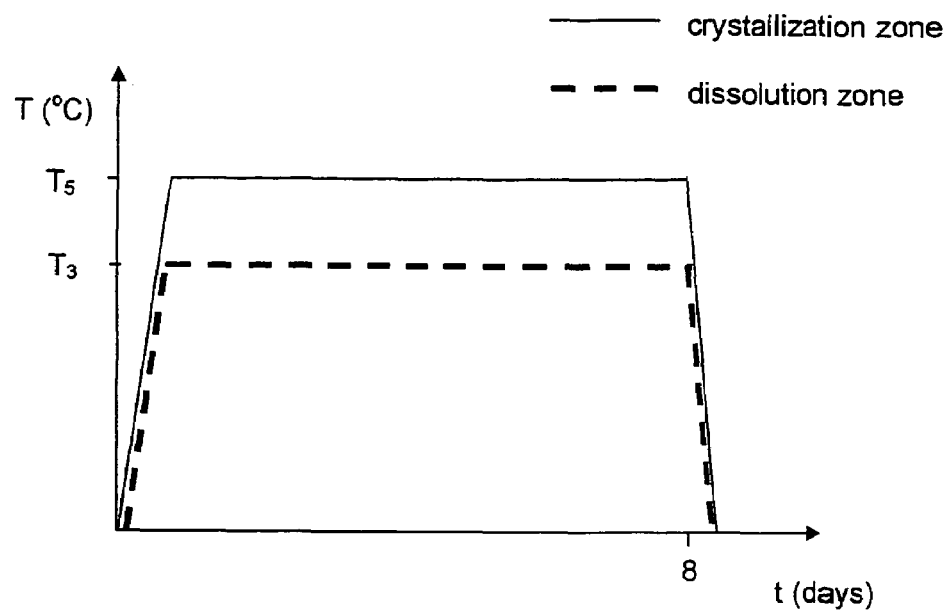
FIG. 8 shows a graph illustrating a change in temperature in an autoclave with the passage of time, in case of Example (6).
Figure 9:
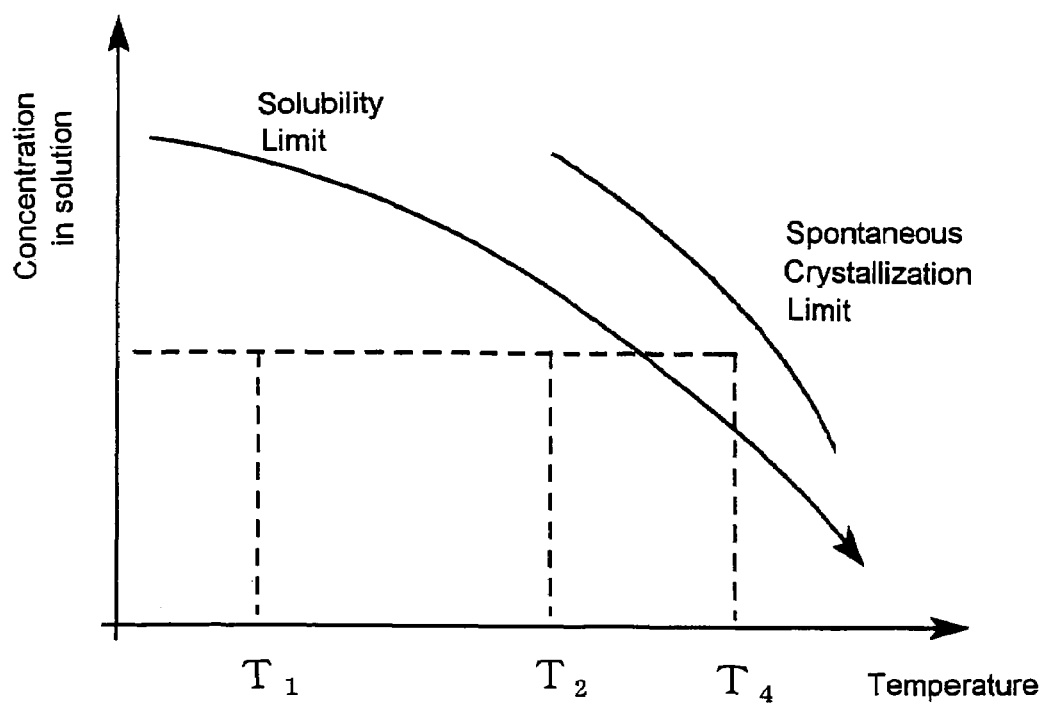
FIG. 9 shows a graph illustrating the temperature dependency of the dissolution limit and the spontaneous crystallization limit in the supercritical ammonia.

(6) A feedstock of an AlN plate obtained by HVPE is set in a dissolution zone (13) in a high-pressure autoclave (1) having a volume of 35.6 cm$^3$. A crystallization seed of a GaN crystal obtained by HVPE is set in a crystallization zone (14). Metallic lithium having a purity of 3N (0.41 g) is further added to the autoclave. Then, ammonia (5N) (14.4 g) is added thereto. The autoclave (1) is closed and set in the furnace unit (4). The temperature of the crystallization zone is raised to $T_5$, and the temperature of the dissolution zone is raised to $T_3$. The resultant pressure in the autoclave (1) is about 2.6 kbars. The autoclave in this state is left to stand alone for 8 days (FIG. 8).

The process according to the present invention is carried out by using the apparatus which forms a bulk monocrystalline aluminum nitride in a supercritical solvent. This apparatus essentially comprises the autoclave (1) for producing the supercritical solvent, and the controller (2) which makes it possible to cause a chemical transport in the supercritical solution in the autoclave (1). This autoclave (1) is set in the chambers (3) of two furnace units (4) equipped with the heaters (5) or the coolers (6). The autoclave (1) was fixed with a bolt locking device (7) and held at a predetermined position relative to the furnace units (4). The furnace units (4) are placed on a hearth (8) and are wound together with the hearth (8) with a steel tape (9) so as to be held immovable. The furnace units (4) with the hearth (8) are set on a turn table (10) and fixed thereto at a specified angle with a pin locking device (11) so that the type of convection and the convection speed in the autoclave (1) can be controlled. The convection of the supercritical solution in the autoclave (1) set in the furnace units (4) is controlled by the convection controller (2) which is composed of at least one horizontal baffle (12) having a hole at the center or at its periphery and which partitions the crystallization zone (14) from the dissolution zone (13). The temperatures of both zones in the autoclave (1) are set at 100 to 800° C., respectively, by a control unit (15) connected to the furnace units (4). The dissolution zone (13) in the autoclave (1) which corresponds to a lower temperature zone of one furnace unit (4) is located above the horizontal baffle (12), and includes the feedstock (16) set therein. The crystallization zone (14) in the autoclave which corresponds to a higher temperature zone of the other furnace unit (4) is located below the horizontal baffle (12). The crystallization seed (17) is set in this zone (14), and specifically is located below an intersecting point of the upstream and the downstream in the convection.

INDUSTRIAL APPLICABILITY

The bulk monocrystalline aluminum nitride thus obtained has a high crystalinity, and therefore can be applied to a substrate for optics such as laser diode, etc. which employ nitride semiconductors. For example, an epitaxial structure of an AlN substrate/undoped AlGaN/Si—AlGaN/undoped AlGaN/Mg—GaN is fabricated, and light is taken up from the AlN substrate. If the ratio of Al in the mixed crystal of AlGaN is larger, the sensitivity to light with a short wavelength is improved. If a mixed crystal of $Al_{0.5}Ga_{0.5}N$ is used, such a semiconductor can have further improved sensitivity up to light with a short wavelength of 280 nm which is far shorter than about 360 nm. The formation of such a highly mixed crystal becomes possible by using a substrate of AlN, but it is difficult if a GaN substrate is used.

The invention claimed is:

1. A process for preparing a bulk monocrystalline aluminum nitride, comprising the steps of forming a supercritical ammonia solvent containing ions of an alkali metal in an autoclave; dissolving an aluminum-containing feedstock in the supercritical ammonia solvent to form a supercritical solution in which the feedstock is dissolved; and crystallizing aluminum nitride on the face of a crystallization seed from the supercritical solution, under a condition of a higher temperature than the temperature found when the feedstock is dissolved in the supercritical solvent.

2. The process according to claim 1, wherein a step of moving the supercritical solution to a higher temperature zone is added, separately from the step of dissolving the feedstock.

3. The process according to claim 1, wherein at least two zones having a difference in temperature therebetween are concurrently formed in the autoclave, and wherein the aluminum-containing feedstock is set in the lower temperature dissolution zone, and the crystallization seed, in the higher temperature crystallization zone.

4. The process according to claim 3, wherein the difference in temperature between the dissolution zone and the crystallization zone is set within such a range that a chemical transport in the supercritical solution can be ensured.

5. The process according to claim 4, wherein the chemical transport in the supercritical solution is caused mainly by convection in the autoclave.

6. The process according to claim 4, wherein the difference in temperature between the dissolution zone and the crystallization zone is 1° C. or more.

7. The process according to claim 1, wherein the aluminum nitride may contain a donor, an acceptor or a magnetic dopant.

8. The process according to claim 1, wherein the supercritical solvent contains $NH_3$ or its derivative.

9. The process according to claim 1, wherein the supercritical solvent contains at least ions of sodium or potassium.

10. The process according to claim 1, wherein the aluminum-containing feedstock is mainly composed of aluminum nitride or its precursor.

11. The process according to claim 10, wherein the precursor is selected from the group consisting of an azide, imide, amidoimide, amide and hydride, each of which contains aluminum.

12. The process according to claim 1, wherein the crystallization seed has a cryatalline layer of a nitride containing at least aluminum or other element of Group III.

13. The process according to claim 1, wherein the cryatalline layer of aluminum nitride in the crystallization seed has a surface dislocation density of $10^6/cm^2$ or less.

14. The process according to claim 1, wherein the crystallization of aluminum nitride is carried out at a temperature of from 400 to 600° C.

15. The process according to claim 1, wherein the crystallization of aluminum nitride is carried under a pressure of from 1,000 to 5,500 bars, preferably from 1,500 to 3,000 bars.

16. The process according to claim 1, wherein the concentration of the ions of the alkali metal in the supercritical solvent is adjusted so that the specified solubilities of the feedstock and aluminum nitride can be ensured.

17. The process according to claim 1, wherein the molar ratio of the ions of the alkali metal to other components in the supercritical solvent is controlled within a range of from 1:200 to 1:2, preferably from 1:100 to 1:5, more preferably from 1:20 to 1:8.

18. A process for preparing a bulk monocrystalline aluminum nitride, comprising the steps of dissolving an aluminum-containing feedstock in a supercritical solvent containing ammonia and ions of an alkali metal in an autoclave, to form a supercritical solution of aluminum nitride whose solubility has a negative temperature coefficient; and selectively growing a crystal of aluminum nitride only on the face of a crystallization seed arranged in the autoclave, from the supercritical solution introduced, by taking advantage of the negative temperature coefficient of the solubility of aluminum nitride.

19. A process for preparing a bulk monocrystalline aluminum nitride, comprising the steps of dissolving an aluminum-containing feedstock in a supercritical solvent containing ammonia and ions of an alkali metal in an autoclave, to form a supercritical solution of aluminum nitride; and selectively growing a crystal of aluminum nitride only on the face of a crystallization seed arranged in the autoclave, from the supercritical solution introduced, by taking advantage of the positive pressure coefficient of the solubility of aluminum nitride.

20. The process according to claim 18, wherein the ions of the alkali metals are introduced in the form of an alkali metal or a mineralizer containing no halogen.

21. The process according to claim 20, wherein the ions of the alkali metal are of one or more selected from the group consisting of $Li^+$, $Na^+$ and $K^+$.

22. The process according to claim 18, wherein the aluminum-containing feedstock dissolved in the supercritical solvent is composed of aluminum nitride or an aluminum precursor capable of producing an aluminum compound soluble in the supercritical solution.

23. The process according to claim 18, wherein the aluminum-containing feedstock is composed of AlN formed by HVPE or AlN formed by other chemical reaction, containing an element which does not hinder an ammonobasic supercritical reaction.

24. The process according to claim 18, wherein the aluminum-containing feedstock is composed of a combination of aluminum nitride which is dissolved in the supercritical ammonia solvent through an equilibrium reaction, and metallic aluminum which irreversibly reacts with the supercritical ammonia solvent.

25. The process according to claim 18, wherein the aluminum-containing feedstock is a sintered body of AlN.

26. The process according to claim 18, wherein the crystallization seed is a monocrystalline AlN.

27. A process for preparing a bulk monocrystalline aluminum nitride, comprising the steps of dissolving an aluminum-containing feedstock in a supercritical solvent containing ammonia and ions of an alkali metal to form a supercritical solution of aluminum nitride whose solubility has a negative temperature coefficient; adjusting the solubility of the supercritical solution below a level of concentration where no spontaneous crystallization occurs, while maintaining oversaturation of the supercritical solution relative to a crystallization seed by raising the temperature to a predetermined temperature or reducing the pressure to a predetermined pressure, at least, in a zone in the autoclave where the crystallization seed is arranged; and selectively growing a crystal of aluminum nitride only on the face of the crystallization seed arranged in the autoclave, from said supercritical solution.

28. The process according to claim 27, wherein two zones, a dissolution zone and a crystallization zone, are concurrently formed in the autoclave, and wherein the oversaturation of the supercritical solution relative to the crystallization seed is controlled by controlling the dissolution temperature and the crystallization temperature.

29. The process according to claim 28, wherein the temperature of the crystallization zone is set at a temperature from 400 to 600° C.

30. The process according to claim 28, wherein a difference in temperature between the two zones, the dissolution zone and the crystallization zone, concurrently formed in the autoclave, is maintained to 150° C. or less, preferably 100° C. or less.

31. The process according to claim 28, wherein the oversaturation of the supercritical solution relative to the crystallization seed is adjusted by providing one or more baffles which partition the lower temperature dissolution zone from the higher temperature crystallization zone, and controlling the convection amount between the dissolution zone and the crystallization zone.

32. The process according to claim 28, wherein a specified difference in temperature is set between the two zones, the dissolution zone and the crystallization zone, formed in the autoclave, and wherein the oversaturation of the supercritical solution relative to the crystallization seed is adjusted by utilizing an aluminum-containing feedstock which is introduced as an AlN crystal having a total surface area larger than the total surface area of the crystallization seed.

* * * * *

UNITED STATES PATENT AND TRADEMARK OFFICE
CERTIFICATE OF CORRECTION

PATENT NO. : 7,374,615 B2  Page 1 of 1
APPLICATION NO. : 10/479858
DATED : May 20, 2008
INVENTOR(S) : Robert Dwilinski et al.

It is certified that error appears in the above-identified patent and that said Letters Patent is hereby corrected as shown below:

On the cover page, in section (73) Assignee:

Please replace "Ammono.SP. ZO.O" with --AMMONO Sp. z o.o.--.

Signed and Sealed this

Seventh Day of April, 2009

JOHN DOLL
*Acting Director of the United States Patent and Trademark Office*